(12) United States Patent
Pohl et al.

(10) Patent No.: US 6,798,045 B2
(45) Date of Patent: Sep. 28, 2004

(54) LEAD FRAME, CIRCUIT BOARD WITH LEAD FRAME, AND METHOD FOR PRODUCING THE LEAD FRAME

(75) Inventors: Jens Pohl, Bernhardswald (DE); Simon Muff, Regensburg (DE); Eckehard Miersch, Schönaich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/771,912

(22) Filed: Jan. 29, 2001

(65) Prior Publication Data

US 2001/0019172 A1 Sep. 6, 2001

Related U.S. Application Data

(63) Continuation of application No. PCT/DE99/02072, filed on Jul. 5, 1999.

(30) Foreign Application Priority Data

Jul. 28, 1998 (DE) .......................................... 198 33 930

(51) Int. Cl.$^7$ .......................................... H01L 23/495
(52) U.S. Cl. ....................... 257/666; 257/777; 257/778; 257/686; 257/691; 438/108; 438/109; 361/760
(58) Field of Search ................................. 257/666, 685, 257/686, 723, 724, 777, 778, 782, 691, 696, 677; 361/760; 438/108, 109

(56) References Cited

U.S. PATENT DOCUMENTS

| | | | |
|---|---|---|---|
| 5,025,306 A | 6/1991 | Johnson et al. ............. 257/700 |
| 5,045,914 A | 9/1991 | Casto et al. ................ 257/693 |
| 5,220,491 A | 6/1993 | Sugano et al. .............. 361/791 |
| 5,260,601 A | 11/1993 | Baudouin et al. ........... 257/678 |
| 5,283,717 A | * | 2/1994 | Hundt ......................... 361/813 |
| 5,288,949 A | | 2/1994 | Crafts ......................... 174/250 |
| 5,363,550 A | * | 11/1994 | Aitken et al. ................. 29/828 |
| 5,451,815 A | * | 9/1995 | Taniguchi et al. ........... 257/696 |
| 5,523,622 A | | 6/1996 | Harada et al. ............... 257/734 |
| 5,563,773 A | * | 10/1996 | Katsumata ................... 361/764 |
| 5,686,764 A | | 11/1997 | Fulcher ....................... 257/778 |
| 5,731,633 A | * | 3/1998 | Clayton ...................... 257/723 |
| 5,734,198 A | | 3/1998 | Stave ........................... 257/666 |
| 5,969,426 A | * | 10/1999 | Baba et al. .................. 257/778 |
| 6,137,164 A | * | 10/2000 | Yew et al. .................... 257/686 |

FOREIGN PATENT DOCUMENTS

| | | |
|---|---|---|
| DE | 38 38 486 A1 | 5/1990 |
| EP | 0 425 775 A1 | 5/1991 |
| EP | 0 849 793 A2 | 6/1998 |
| JP | 1-86545 | 3/1989 |
| JP | 6-77392 | 3/1994 |
| JP | 09213868 | 8/1997 |
| JP | 10144965 A * | 5/1998 |
| WO | WO 84/01470 | 4/1984 |
| WO | WO 97/50123 | 12/1997 |

OTHER PUBLICATIONS

Charles A. Harper: "Electronic Packaging and Interconnection Handbook", McGraw–Hill, New York, 1991, chapter 9.3.2.

* cited by examiner

*Primary Examiner*—Bradley Baumeister
*Assistant Examiner*—Chris C Chu
(74) *Attorney, Agent, or Firm*—Laurence A. Greenberg; Werner H. Stemer; Ralph E. Locher

(57) ABSTRACT

A lead frame is described which has at least one integrated electronic circuit. The integrated electronic circuit is situated in a region of a main area of the lead frame. The lead frame has at least one signal line, at least one electrically insulating plate, and an electrically conductive, grounded plate are situated. The electrically insulating plate, and the electrically conductive, grounded plate are situated, at least in sections, between the integrated electronic circuit and the signal line. A method for producing the lead frame is also described.

13 Claims, 4 Drawing Sheets

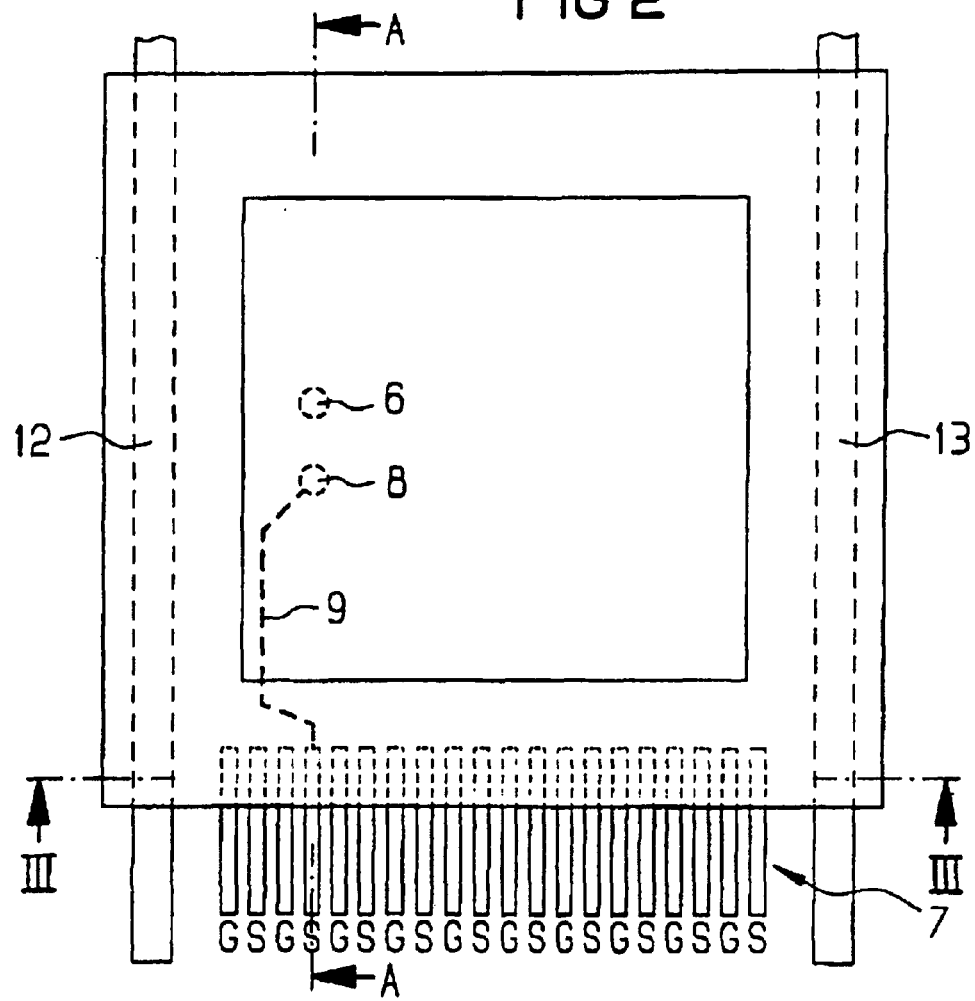
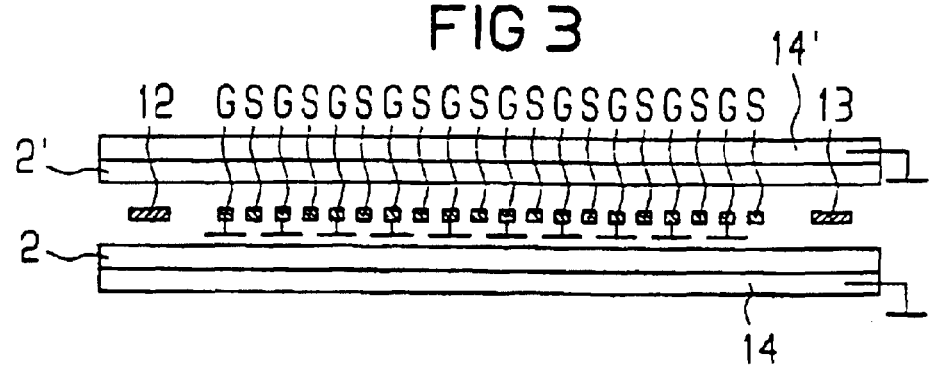

LEAD FRAME, CIRCUIT BOARD WITH LEAD FRAME, AND METHOD FOR PRODUCING THE LEAD FRAME

CROSS-REFERENCE TO RELATED APPLICATION

This application is a continuation of copending International Application No. PCT/DE99/02072, filed Jul. 5, 1999, which designated the United States.

BACKGROUND OF THE INVENTION

Field of the Invention

The invention relates to a lead frame, a circuit board with at least one lead frame, and a method for producing the lead frame.

The prior art discloses diverse types of packages in which integrated electronic circuits are packaged in suitable housings. Whereas ceramic housings that are complicated to produce are often used in the case of logic modules, there is a demand for housings that can be produced as simply as possible in the case of memory modules intended for mass production. It is customary, therefore, to surround memory modules with plastic housings that can be produced in a simple manner. The housings have the task of hermetically sealing the memory modules from ambient influences, in particular moisture, producing an electrical contact to the outside, and effectively dissipating any heat produced.

While it is the case with conventional memory modules that the known housings essentially satisfy all the requirements occurring during practical use, in the case of fast memory modules (high performance dynamic random access memories DRAMs) particularly stringent requirements are imposed in respect to dissipating thermal power loss, ensuring the electrical function, and also high numbers of connections (pins, IOs). In particular, it is necessary to minimize parasitic inductances, capacitances and resistances.

SUMMARY OF THE INVENTION

It is accordingly an object of the invention to provide a lead frame, a circuit board with the lead frame, and a method for producing the lead frame which overcomes the above-mentioned disadvantages of the prior art devices of this general type, which has the lowest possible structural outlay.

With the foregoing and other objects in view there is provided, in accordance with the invention, a lead frame assembly containing at least one integrated electronic circuit having a contact point. A lead frame having a main area is provided and the integrated electronic circuit is disposed in a region above the main area. A connection element is disposed on the lead frame, and at least one signal line being a path that connects the contact point to the connection element and runs parallel to a plane defined by the integrated electronic circuit. At least one electrically insulating plate is provided along with an electrically conductive, grounded plate which is disposed on the at least one electrically insulating plate. The electrically conductive, grounded plate and the at least one electrically insulating plate are disposed, at least in sections, between the integrated electronic circuit and the signal line and connect the lead frame to the integrated electronic circuit.

According to the invention, the object is achieved by a lead frame assembly having at least one integrated electronic circuit, in which case the integrated electronic circuit is situated in the region of the main area of the lead frame. The lead frame assembly has at least one signal line, in which case at least one electrically insulating plate and the electrically conductive, grounded plate are situated, at least in sections, between the integrated electronic circuit and the signal line.

The signal lines connect functional elements of the integrated electronic circuit to one or more suitable connections. The lead frame assembly according to the invention minimizes parasitic electrical parameters such as inductance, capacitance and resistance of the geometrical structure. Very good electrical and signaling reliability is also achieved in the case of integrated electronic circuits having high switching speeds, in particular in the case of fast memory modules (high performance DRAMs), with particularly stringent requirements imposed on ensuring the electrical function.

Particularly good space utilization can be obtained by virtue of the fact that the signal line runs, at least in sections, within the lead frame.

A further improvement in the space utilization is achieved by virtue of the fact that in each case at least one integrated electronic circuit is situated above two main areas of the lead frame.

The electrical reliability is increased further by virtue of the fact that the signal line runs, at least in sections, parallel to the integrated electronic circuit.

In order to avoid thermal loading on the integrated electronic circuit, it is expedient that the lead frame is provided with at least one heat distributor.

As a result of this, the lead frame is used as a cooling lug for the integrated electronic circuits.

This is done in a particularly simple and expedient manner by virtue of the fact that the heat distributor is in thermal contact with a heat conductor which, at least in regions, penetrates through the lead frame.

The invention furthermore provides for a circuit board populated with integrated electronic circuits to be configured in such a way that it contains at least one lead frame assembly according to the invention.

Particularly good space utilization can be obtained by virtue of the fact that it has a main circuit board, and that the lead frame assembly is disposed essentially perpendicularly to the main circuit board.

Furthermore, it is expedient that the main circuit board contains a multiplicity of lead frame assemblies, and that the lead frames assemblies are disposed essentially parallel and/or in a coplanar manner with respect to one another.

The invention furthermore relates to a method for producing the lead frame assembly provided with at least one integrated electronic circuit, in which case the lead frame is provided with at least one signal line and in which case the integrated electronic circuit is applied in such a way that at least one electrically insulating plate and an electrically conductive, grounded plate are situated, at least in sections, between the integrated electronic circuit and the signal line.

If there are a multiplicity of signal lines, their influence on each other, the so-called crosstalk, can be avoided by virtue of the fact that the signal lines are each electrically shielded by two adjacent ground lines.

In accordance with an added feature of the invention, the signal line runs, at least in sections, within the lead frame.

In accordance with an additional feature of the invention, the main area is one of two main areas and the at least one integrated electronic circuit is one of at least two integrated electronic circuits and in each case at least one of the integrated circuits is disposed above each of the two main areas.

In accordance with another feature of the invention, the signal line runs, at least in sections, parallel to the integrated electronic circuit.

In accordance with a further feature of the invention, at least one of the integrated electronic circuits contains a memory cell configuration.

In accordance with another added feature of the invention, at least one heat distributor is disposed in the lead frame.

In accordance with another additional feature of the invention, the heat distributor contains, at least in regions, a heat conductor penetrating through the lead frame.

In accordance with a further added feature of the invention, a plurality of ground lines are provided. The signal line is one of a plurality of signal lines, and each of the signal lines is shielded by two adjacent ones of the ground lines.

In accordance with a further additional feature of the invention, the connection element is disposed in at least one edge area of the lead frame.

With the foregoing and other objects in view there is provided, in accordance with the invention, a circuit board containing at least one lead frame assembly. The lead frame assembly includes at least one integrated electronic circuit having a contact point, a lead frame having a main area and the integrated electronic circuit is disposed in a region above the main area, a connection element disposed on the lead frame, at least one signal line being a path connecting the contact point to the connection element and running parallel to a plane defined by the integrated electronic circuit, at least one electrically insulating plate, and an electrically conductive, grounded plate disposed on the at least one electrically insulating plate. The electrically conductive, grounded plate and the at least one electrically insulating plate are disposed, at least in sections, between the integrated electronic circuit and the signal line and connect the lead frame to the integrated electronic circuit.

In accordance with an added feature of the invention, a main circuit board is provided, and the lead frame assembly is disposed substantially perpendicularly to the main circuit board.

In accordance with another feature of the invention, the lead frame assembly is one of a multiplicity of lead frame assemblies disposed on the main circuit board. The lead frame assemblies are disposed substantially parallel and/or in a coplanar manner with respect to one another.

With the foregoing and other objects in view there is provided, in accordance with the invention, a method for producing a lead frame assembly. The method includes the step of: providing a lead frame having at least one signal line; providing at least one electrically insulating plate; disposing an electrically conductive grounded plate on the electrically insulating plate; and applying at least one integrated electronic circuit such that the electrically conductive grounded plate and the at least one electrically insulating plate are disposed, at least in sections, between the integrated electronic circuit and the signal line.

Other features which are considered as characteristic for the invention are set forth in the appended claims.

Although the invention is illustrated and described herein as embodied in a lead frame, a circuit board with the lead frame, and a method for producing the lead frame, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is a plan view of the lead frame assembly;

FIG. 3 is a sectional view through the lead frame assembly illustrated in FIG. 2, taken along the line III—III;

DESCRIPTION OF THE PREFERRED EMBODIMENTS

Figure 1:
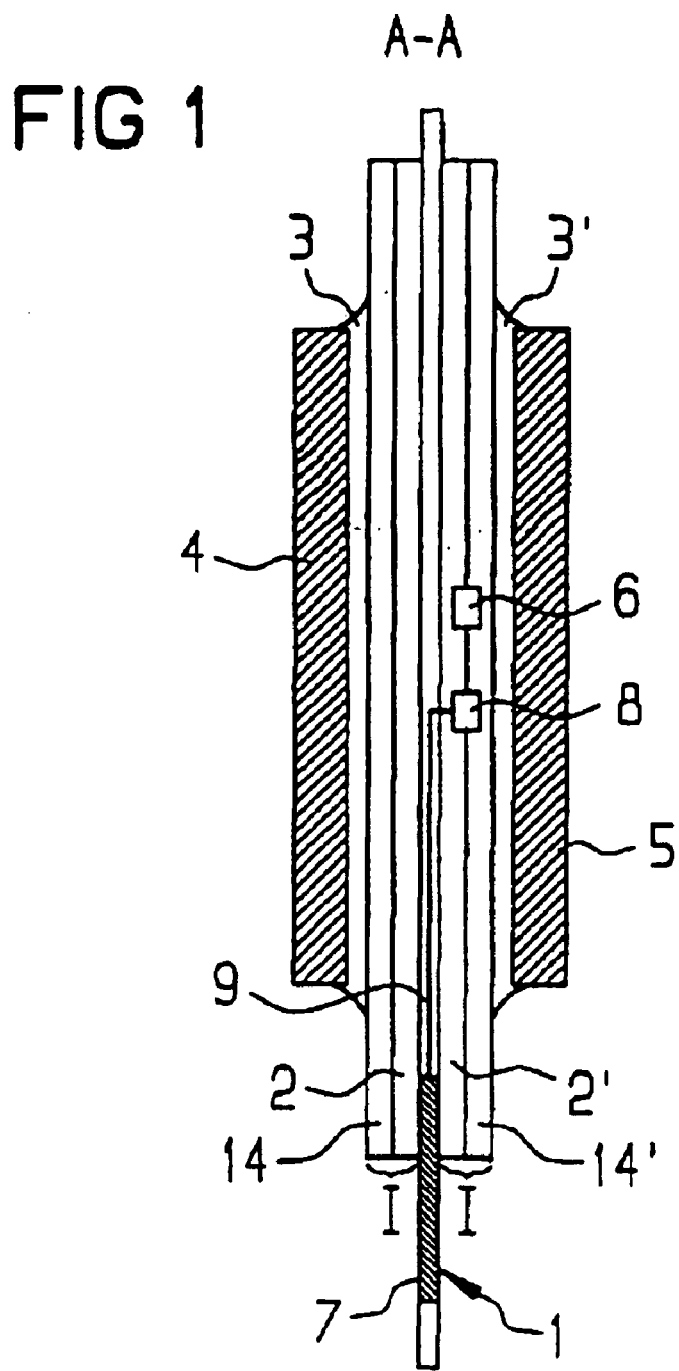
FIG. 1 is a diagrammatic, cross-sectional view through a lead frame assembly perpendicular to a plane in which integrated electronic circuits are situated.

In all the figures of the drawing, sub-features and integral parts that correspond to one another bear the same reference symbol in each case. Referring now to the figures of the drawing in detail and first, particularly, to FIG. 1 thereof, there is shown a lead frame assembly containing a lead frame 1 connected to integrated electronic circuits 4, 5 in a region of its main areas 10 through insulation layers 2, 2', 3, 3' and electrically conductive, grounded base plates (ground planes) 14, 14'.

The integrated electronic circuits 4, 5 have thermal conductors 6, just a single one of which is shown enlarged, by way of example, in the illustration. The thermal conductors 6 are contact holes filled with a thermally conductive material. They are produced in the same way as electrically conductive contact points 8 but are not electrically connected, rather they serve only to conduct heat.

The integrated electronic circuits 4, 5 are connected via the electrically conductive contact points 8 to signal lines 9 which end in a connection element 7 on the lead frame 1.

In its edge region, the lead frame 1 joins the connection element 7, which can be plugged into a printed circuit board configuration or into another suitable insertion location.

The connection of the signal lines 9 from the integrated electronic circuits 4, 5 to the connection element 7 is effected via the electrically conductive contact points 8, which are embedded in the insulation layers 2, 2', 3, 3'.

Such a configuration of the insulation layers 2, 2', 3, 3' and the signal lines 9 embedded therein is referred to as an interposer I.

The connection through the insulation layers 2, 2', 3, 3' is particularly expedient if the integrated electronic circuits 4, 5 are present in the form of configured chips (existing packages). By contrast, a connection via a further lead frame, which preferably has ramified lines and is preferably fitted on a further insulating plate, is suitable particularly in the case of non-configured electronic circuits.

In order to enhance clarity, the electrical connecting lines are not illustrated in FIG. 1.

The signal lines 9 are laid by way of example in accordance with the embodiment illustrated in FIG. 2. The signal lines 9 in each case extend from a signal connection S in the region of the connection element 7 as far as the contact point 8. The signal connections S are each situated between two ground potential connections G. Preferably, all the signal lines 9 have an identical length and are multiply connected by suitable wiring (interposer routing) to the integrated electronic circuits 4, 5, a wide bus system thereby being formed.

Heat distributors 12, 13 penetrate through the entire region of the lead frame 1.

FIG. 3 shows a cross section through the lead frame assembly illustrated in FIGS. 1 and 2, through the sectional plane III—III in the region of the signal connections S in FIG. 2. The signal connections S, which join the signal lines 9 in a higher plane (not illustrated), are electrically shielded by two ground potential connections G and by the two electrically conductive, grounded base plates 14, 14'. The signal lines 9 are also electrically shielded by the base plates 14, 14' and in each case two adjacent ground lines disposed in extension of the ground potential connections G. The ground lines disposed in extension of the ground potential connections G preferably have identical lengths just like the signal lines, so that the electrical shielding of the signal lines 9 is improved even further.

Figure 4:
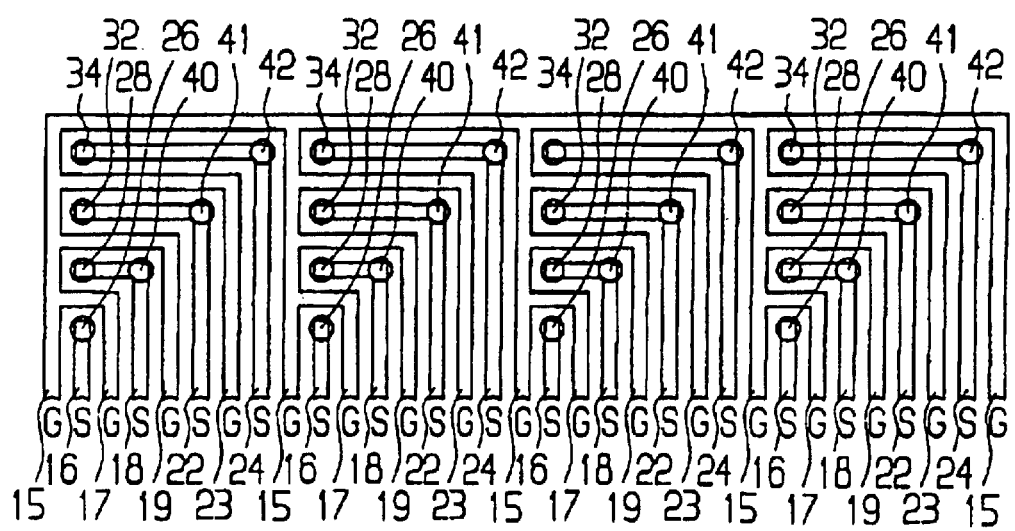
FIG. 4 is a sectional view through an expedient configuration of conductor tracks in a further lead frame assembly.

FIG. 4 shows a section through an alternative, equally expedient, configuration of conductor tracks in a further lead frame according to the invention.

In this case, signal lines 16, 18, 22, 24 proceeding from the signal connections S are each electrically shielded by two adjacent ground lines 15, 17, 19, 23 proceeding from one of the ground potential connections G. The signal lines 16, 18, 22, 24 join contact points 26, 28, 32, 34. The ground lines 15, 17, 19, 23 can combine in a common line, preferably the ground line 15, to the side of a vertical line formed from the contact points 26, 28, 32, 34.

The four contact points 26, 28, 32, 34 form a contact matrix with corresponding further contact points, a contact matrix having 4×4 contact points being illustrated in the present case.

Thermal conductors 40, 41, 42 enable good heat dissipation.

The illustrated configuration of the conductor tracks is particularly advantageous because it combines good electrical shielding of the signal lines 16, 18, 22, 24 with a high dissipation of heat. However, there are also other configurations of the signal lines, ground lines, contact points or thermal conductors in order to configure other embodiments of the lead frames according to the invention.

Figure 5:
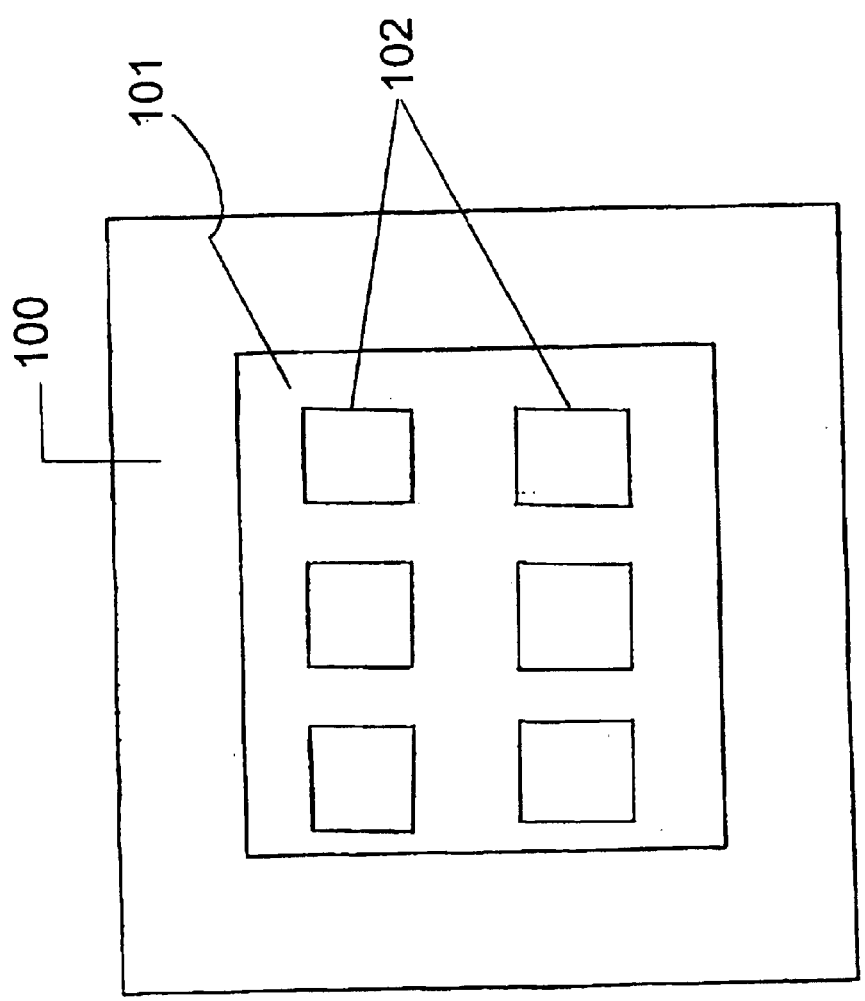
FIG. 5 is a plan view of a plurality of lead frame assemblies disposed on a printed circuit board.

FIG. 5 shows a printed circuit board 100 having a main circuit board 101 with a plurality of the lead frame assemblies 102, as described above, disposed on the main circuit board 101.

We claim:

1. A lead frame assembly, comprising:
   at least one integrated electronic circuit having a contact point;
   a lead frame having a main area and said integrated electronic circuit disposed in a region above said main area;
   a connection element disposed on said lead frame;
   at least one signal line connecting said contact point to said connection element and running parallel to a plane defined by said integrated electronic circuit;
   at least one electrically insulating plate; and
   an electrically conductive, grounded shielding plate constructed for shielding and minimizing parasitic inductances, capacitances, and resistances in said at least one signal line, said electrically conductive, grounded shielding plate disposed on said at least one electrically insulating plate, said electrically conductive, grounded plate and said at least one electrically insulating plate disposed, at least in sections, between said integrated electronic circuit and said signal line.

2. The lead frame assembly according to claim 1, wherein said signal line runs, at least in sections, within said lead frame.

3. The lead frame assembly according to claim 1, wherein said main area is one of two main areas and said at least one integrated electronic circuit is at least two integrated electronic circuits and in each case at least one of said integrated circuits is disposed above each of said two main areas.

4. The lead frame assembly according to claim 1, wherein said signal line nine, at least in sections, parallel to said integrated electronic circuit.

5. The lead frame assembly according to claim 3, wherein at least one of said integrated electronic circuits contains a memory cell configuration.

6. The lead frame assembly according to claim 1, including at least one heat distributor is disposed in said lead frame.

7. The lead frame assembly according to claim 6, wherein said at least one heat distributor contains, at least in regions, a heat conductor penetrating through said lead frame.

8. The lead frame assembly according to claim 1, including a plurality of ground lines, said at least one signal line is one of a plurality of signal lines, and each of said signal lines is shielded by two adjacent ones of said ground lines.

9. The lead frame assembly according to claim 1, wherein said connection element is disposed in at least one edge area of said lead frame.

10. A circuit board, comprising:
    at least one lead frame assembly, including:
      at least one integrated electronic circuit having a contact point;
      a lead frame having a main area and said integrated electronic circuit disposed in a region above said main area;
      a connection element disposed on said lead frame;
      at least one signal line connecting said contact point to said connection element and running parallel to a plane defined by said integrated electronic circuit;
      at least one electrically insulating plate; and
      an electrically conductive, grounded shielding plate constructed for shielding and minimizing parasitic inductances, capacitances, and resistances in said at least one signal line, said electrically conductive, grounded shielding plate disposed on said at least one electrically insulating plate, said electrically conductive, grounded plate and said at least one electrically insulating plate disposed, at least in sections, between said integrated electronic circuit and said signal line.

11. The circuit board according to claim 10, including a main circuit board, and said at least one lead frame assembly is disposed substantially perpendicularly to said main circuit board.

12. The circuit board according to claim 11, wherein said lead frame assembly is one of a multiplicity of lead frame assemblies disposed on said main circuit board and said lead frame assemblies are disposed at least one of substantially parallel and in a coplanar manner with respect to one another.

13. A method for producing a lead frame assembly, which comprises the steps of:
providing a lead frame having at least one signal line and a connection element;
providing at least one electrically insulating plate;
disposing an electrically conductive grounded shielding plate on the electrically insulating plate, the electrically conductive grounded shielding plate shielding and minimizing parasitic inductances, capacitances, and resistances in the signal line, and
applying at least one integrated electronic circuit such that the electrically conductive grounded shielding plate and the at least one electrically insulating plate are disposed, at least in sections, between the integrated electronic circuit and the signal line, the integrated electronic circuit having a contact point connected to the connection element by the signal line and the signal line running parallel to a plane defined by the integrated electronic circuit.

* * * * *